United States Patent [19]

Compton et al.

[11] Patent Number: 4,636,728
[45] Date of Patent: Jan. 13, 1987

[54] OFFSET GRADIENT FIELDS IN NUCLEAR MAGNETIC RESONANCE IMAGING SYSTEMS

[75] Inventors: Russell A. Compton, Chesterland; Waldo S. Hinshaw; David M. Kramer, both of Cleveland Heights, all of Ohio

[73] Assignee: Technicare Corporation, Solon, Ohio

[21] Appl. No.: 621,396

[22] Filed: Jun. 18, 1984

[30] Foreign Application Priority Data

Aug. 5, 1983 [GB] United Kingdom ................. 8321236

[51] Int. Cl.$^4$ ............................................. G01R 33/20
[52] U.S. Cl. ...................................... 324/309; 324/318
[58] Field of Search ............... 324/307, 309, 318, 319, 324/320, 313; 335/216, 299; 336/DIG. 1

[56] References Cited

U.S. PATENT DOCUMENTS

| | | | |
|---|---|---|---|
| 4,015,196 | 3/1977 | Moore et al. | 324/309 |
| 4,284,948 | 8/1981 | Young | 324/309 |
| 4,297,637 | 10/1981 | Crooks et al. | 324/309 |
| 4,422,042 | 12/1983 | Sugimoto | 324/309 |
| 4,475,084 | 10/1984 | Moore et al. | 324/309 |
| 4,486,711 | 12/1984 | Frese et al. | 324/319 |

FOREIGN PATENT DOCUMENTS

| | | |
|---|---|---|
| 0055058 | 6/1982 | European Pat. Off. . |
| 0108421 | 5/1984 | European Pat. Off. . |
| 2128746 | 5/1984 | United Kingdom . |

OTHER PUBLICATIONS

Hinshaw, "Spin Mapping: The Application of Moving Gradients to NMR", Physics Letters, vol. 48A, No. 2, Jun. 3, 1974.

Primary Examiner—Stewart J. Levy
Assistant Examiner—Kevin D. O'Shea
Attorney, Agent, or Firm—W. Brinton Yorks, Jr.

[57] ABSTRACT

The null point in the gradient field of an NMR imaging system is offset from its nominal position in the static magnetic field by application of a bias field to the gradient field. The bias field produces a substantially uniform offset in the field intensity at every point in the gradient field. Alternatively, null point offset may be achieved by controllably superimposing two gradient fields of separately located null points.

13 Claims, 12 Drawing Figures

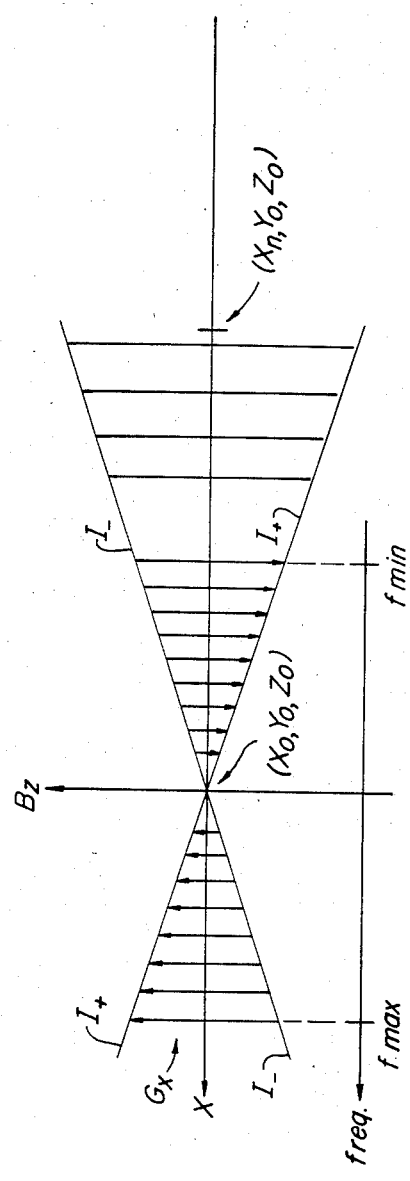
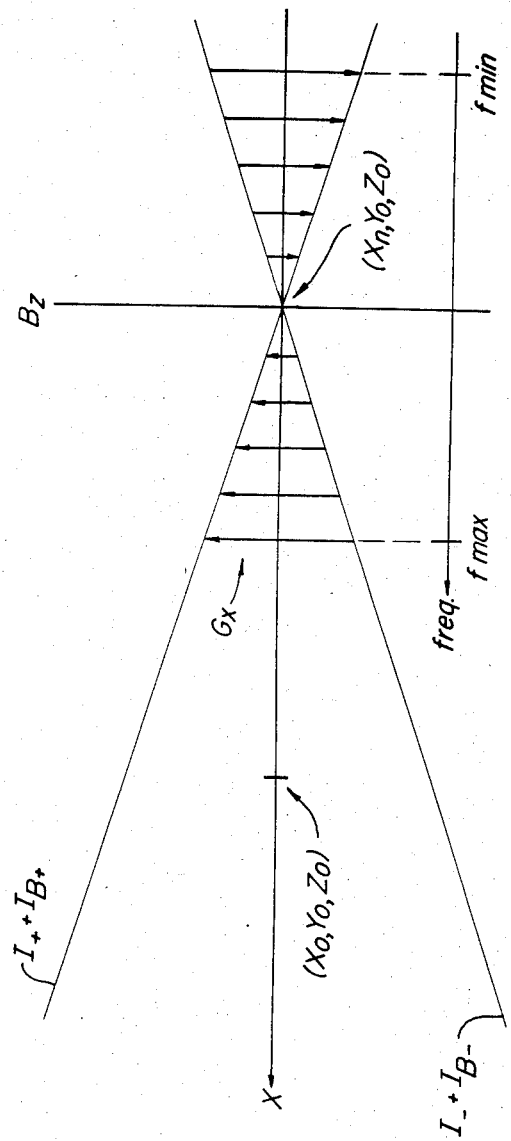
FIG-3a
FIG-3b

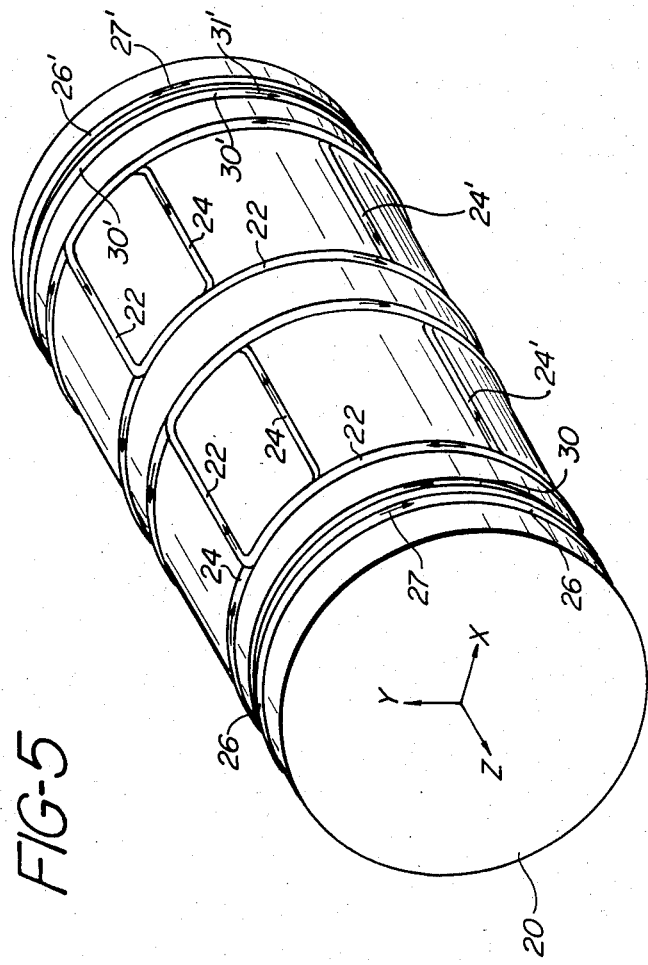

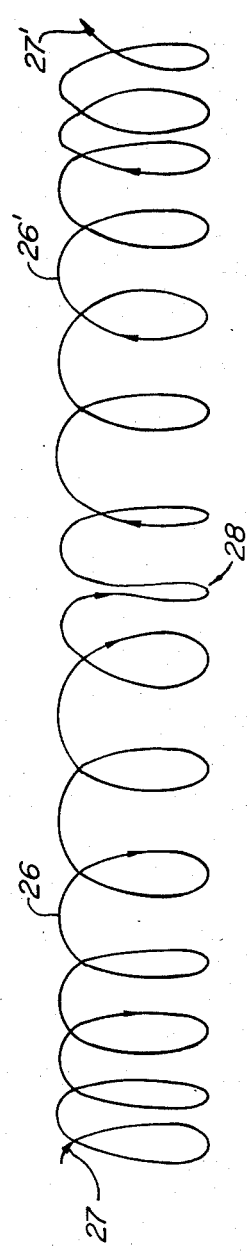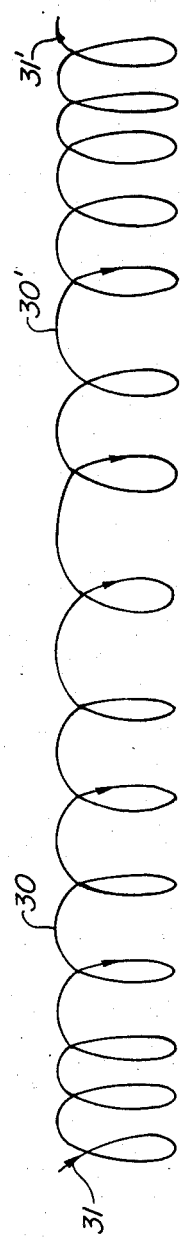
FIG-6
FIG-7

FIG-8
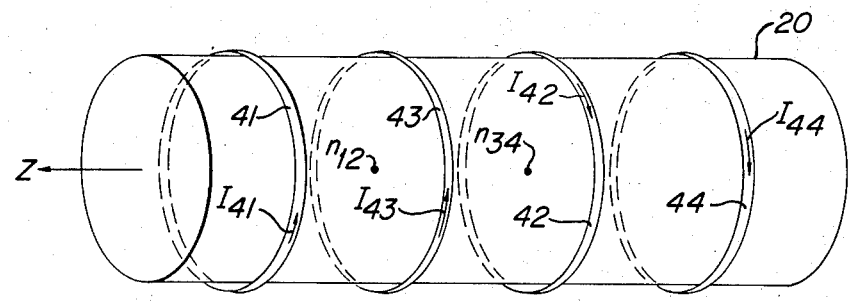
FIG-9a
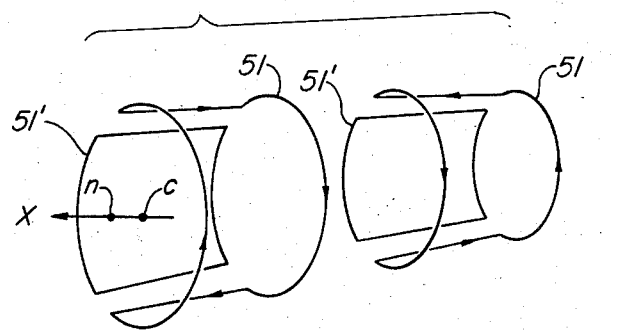
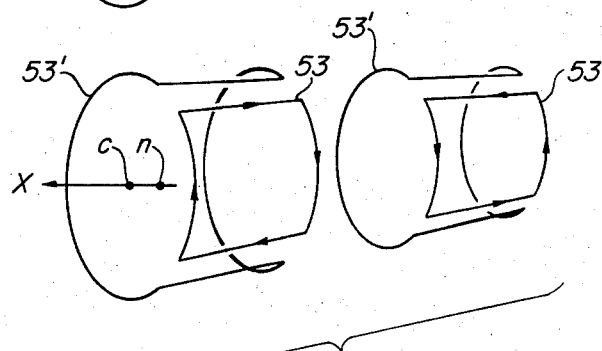
FIG-9b

OFFSET GRADIENT FIELDS IN NUCLEAR MAGNETIC RESONANCE IMAGING SYSTEMS

This invention relates to gradient fields in nuclear magnetic resonance (NMR) imaging systems and, in particular, to techniques for offsetting gradient fields from their nominal origins in the system.

The principles of NMR may be employed to form images of various materials. The material to be imaged is placed in a uniform static magnetic field, which causes the spin vectors of atomic nuclei to become aligned in the direction of the magnetic field vector. The spin vectors are then disturbed from their equilibrium alignment in a controlled manner by energy produced by a radio frequency (r.f.) coil, which reorients the spin vectors to a new alignment. When the radio frequency energy is removed, the spin vectors begin to return to their equilibrium alignment with the static field, and emit energy in the process. The emitted signals comprise the total contribution of many individual signals and the total signal may therefore be termed a bulk magnetization signal. The bulk magnetization signal is detected by an r.f. receiving coil and may thereafter be processed to produce an image of the material in terms of the characteristics of the content of its atomic nuclei.

In order to form a planar image of the material it is necessary to be able to positionally identify the source or sources of the NMR signal. For the formation of a two dimensional image having x and y coordinates for instance, the nuclear signals must be encoded so that they will exhibit characteristics upon reception which identify their sources positionally in both the x and y directions.

This encoding is conventionally performed by imposing gradient fields upon the static magnetic field. The gradient fields are developed by gradient coils, and may perform positional encoding by either phase encoding or frequency encoding. In phase encoding, the nuclei are subjected to a momentary gradient field before the nuclear signals are acquired, or "read". The momentary gradient field during its application exhibits a magnitude which varies linearly with position in a desired direction in the region of the imaged material, and acts to momentarily shift the frequencies of the spin vectors as a function of position. Following application of the gradient the spin vectors of nuclei in the material return to their initial Larmor frequency, but as a result of the momentary frequency shift, they are now preencoded in phase. When the nuclear signals are subsequently read, signals emitted from different positions in the direction of the gradient will exhibit different relative phases. Through signal phase detection, the location of the sources of the signals in the direction of the gradient may be determined.

In the frequency encoding technique, the gradient field is applied during the time of signal acquisition, when the nuclear signals are read. As before, this gradient field exhibits a magnitude which varies linearly with position along the desired direction of the gradient. Because the Larmor frequency of a spinning nucleus is a function of the magnitude of the magnetic field applied to it, nuclei at different positions along the gradient direction will exhibit different Larmor frequencies which are a function of the positionally varying gradient field. Thus, the frequencies of the acquired nuclear signals will identify the position of the nuclei along the gradient direction.

In two dimensional imaging, phase encoding may be used to positionally identify the y coordinate of a spinning nucleus, and frequency encoding may be used to positionally identify its x coordinate, for instance.

The gradient coils used in an NMR system for imaging the human body are generally wound around a cylindrical coil form. The gradient fields are developed within the cylinder, where the patient being imaged is located. The gradient coils are usually wound in a symmetrical fashion with respect to the center axis of the cylinder, thereby producing gradient fields which are symmetrical with respect to the center axis of the cylinder. The cylinder and coils are conventionally oriented so that the cylinder center axis is aligned with the static magnetic field $B_o$. The center axis may then be taken as the z axis of the system, with x and y axes oriented normal to the center axis and to each other. Since there are three dimensions, x, y and z, in the space within the cylinder, most NMR imaging systems provide three gradient coils for the production of gradient fields in the x, y and z directions. The symmetry of the gradient coils and fields thus generally results in the location of a symmetrical center point in the center of the system on the z, or center, axis. The three gradient fields then vary linearly in opposite senses in their respective directions about this center point.

In this type of system in which the gradient fields vary in opposite senses about the center point, the gradient fields exhibit essentially no effect at the center point. The center point is then a null point for the gradients, as they have zero values at this point. When the null point is in the center of the region being imaged, frequency encoding will result in signals from material at the null point exhibiting the nominal Larmor frequency for the static $B_o$ field. Signals originating from material on either side of the null point will exhibit frequencies above and below this nominal frequency. The received signals may then be passed through a bandpass filter centered at the nominal frequency for an improved signal-to-noise ratio, and the symmetry of frequencies will lend itself to array processing and Fourier transform reconstruction.

However, when the region being imaged is centered about a point other than the null point, the above advantages of symmetry are no longer present. The passband of the bandpass filter must then be changed to the frequencies resulting from the gradient fields in the region of interest, or the same filter must have an undesirably broad passband to accommodate a broader frequency range, which adversely affects the signal-to-noise ratio.

It would therefore be desirable to retain the benfits of symmetry and a narrow bandpass filter by relocating the gradient null point to the center of the region being imaged. This is not easily done, due to the symmetrical nature of the gradient coils, which may be symmetrical with respect to both the z axis and x-y axes passing through a null point on the center of the z axis. It is possible, though, to configure a gradient coil in opposing halves, which permits a shifting of the null point by driving the coil halves with uniquely related signals. This technique, however, requires great precision in both the drive signal formation and coil winding. Coil winding complexity is significant, as six gradient coils, arranged in pairs, are needed for three-dimensional null point offset. In addition, the gradient field would most likely become increasingly nonlinear as the null point displacement is increased.

In accordance with the principles of the present invention, a gradient field and its null point are offset from their normal location in an NMR imaging system through the use of a bias field, which produces a substantially uniform offset in the magnetic field of the system. The effective null point created by the combined effects of the gradient and bias fields may then be located at substantially any point within the gradient field. In a preferred embodiment, the bias field is developed by a separate bias coil, which generates a bias field that is linearly related to the gradient field being offset. Unlike the gradient coils, the bias coil develops a gradient field effect at the null point of the field of the gradient coil.

In the drawings:

FIGS. 3a and 3b illustrate gradient and bias field vectors;

FIG. 5 illustrates schematically the gradient and bias coils of an NMR imaging system constructed in accordance with the principles of the present invention;

FIGS. 6 and 7 illustrate the winding of z gradient and bias coils shown schematically in FIG. 5; and FIGS. 8, 9a, and 9b illustrate gradient null point offset through the use of double gradient coils.

Figure 1:
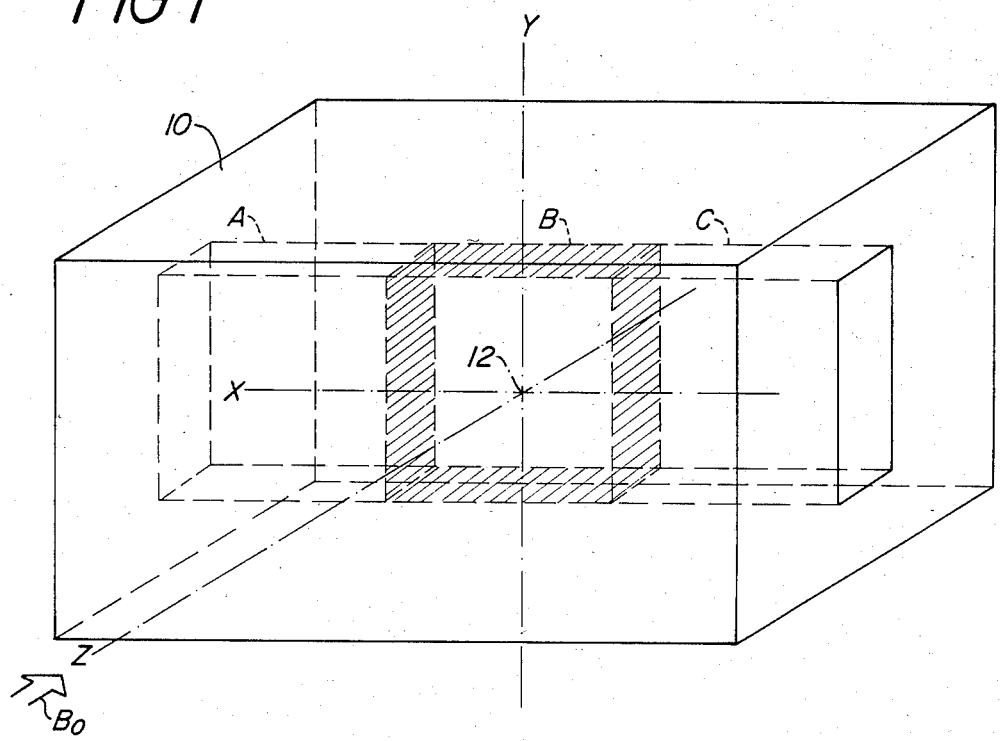
FIGS. 1 and 2 represents regions being imaged in an NMR imaging system.

Referring to FIG. 1, a body of material 10 which is to be imaged in an NMR system is illustrated. Within the body 10 are three smaller rectangular blades A, B, and C. Block B is separately identified by its shaded sides. The NMR system has three reference axes, x, y and z. The reference axes all intersect at a common point 12 in the center of block B. The static magnetic field $B_o$ is oriented in the direction of the z axis.

Figure 2:
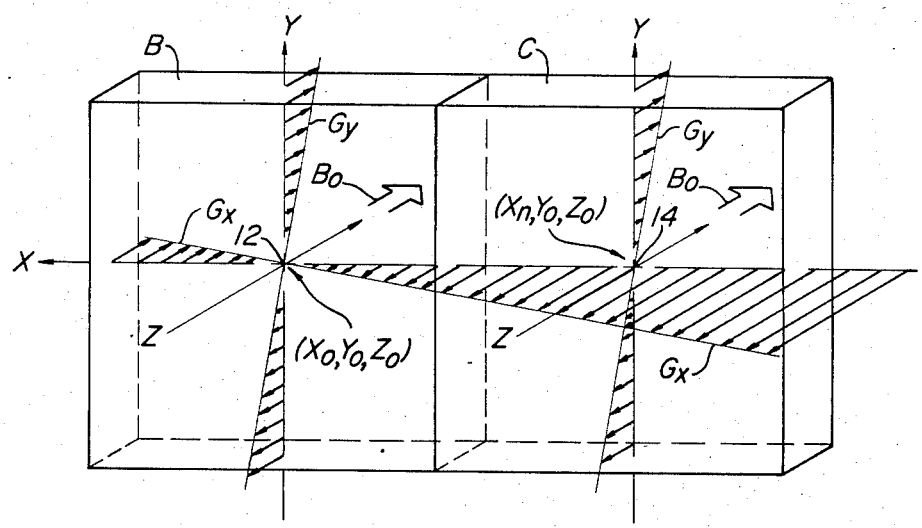

In FIG. 1, the center point 12 is also taken to be the center of gradient fields of the system. Referring to FIG. 2, two gradients in the x and y directions, $G_x$ and $G_y$, respectively, are shown in an enlarged view of blocks B and C of FIG. 1. The $G_x$ gradient is applied to the static field $B_o$, with a field strength variation in the x direction. Similarly, the $G_y$ gradient is also a variation of the static field $B_o$, but the variation is in the y direction. The field variation of each gradient proceeds linearly in opposite senses from the common intersection point 12, a null point. At the null point, the gradients make no contribution to the net magnetic field, which remains at the value of the static field $B_o$. Since the null point 12 is a point of reference for all three gradients, including a z directional gradient $G_z$ which is not illustrated in FIGS. 1 and 2, the null point is designated as having coordinates $X_o$, $Y_o$, $Z_o$.

In FIG. 2, the illustrated gradients are seen to be symmetrically distributed with respect to block B. This distribution lends itself well to imaging block B using a narrow range of frequencies for spatial identity, which will be discussed more fully with respect to FIGS. 3a and 3b. However, these conditions of symmetry do not apply to block C. The center 14 of block C is on the null plane of the z gradient along the z direction, which is the plane where the z gradient exhibits a magnitude of zero, or $z_o$. The center 14 of block C is also on the null plane of the $G_y$ gradient, where that gradient makes a zero magnitude contribution to the static $B_o$ field. But the center 14 is not on the null plane of the $G_x$ gradient; it is at a point where the $G_x$ gradient has a magnitude $X_n$. The center 14 of block C may thus be designated as having coordinates $X_n$, $Y_o$, $Z_o$. It would be desirable when imaging block C for the common null point of the three gradients to be shifted, or offset to the $x_n$, $y_o$, $z_o$ coordinate. In FIG. 3a, the x-directed gradient $G_x$ of FIG. 2 is shown in the plane of the drawing, as if the x axis of FIG. 2 were viewed from the top of blocks B and C. The $G_x$ vector arrows are shown distributed in opposing polarity variation about the $x_o$, $y_o$, $z_o$ coordinate, and are bounded by lines representing opposite polarity driving currents $I_+$ and $I_-$ of an x gradient coil. As is well known, resonant nuclei will emit signals at their Larmor frequencies, which frequencies are equal to the strength of the magnetic field multiplied by the gyromagnetic ratio, which is unique for each nuclear species of nonzero spin. For a given nuclear species, such as hydrogen, nuclei at the $x_o$, $y_o$, $z_o$ null point of the $G_x$ gradient field will emit signals which are a product of the strength of the static magnetic field $B_o$, since the $G_x$ gradient makes no contribution to the static field at that point. The $G_x$ gradient field adds to and decreases the magnetic field strength on either side of the null point in FIG. 3a, so that nuclei at those points will exhibit slightly higher and lower Larmor frequencies. This range of frequencies is indicated by the frequency range $f_{min}$ to $f_{max}$ shown below the x axis. In this example, the $f_{min}$ to $f_{max}$ frequency range indicates x- coordinate locations for nuclei in block B.

Block C, however, is located in a different $G_x$ gradient field, with the center of the block at coordinates $x_n$, $y_o$, $z_o$. The vector arrows of the $G_x$ field are increasingly negative-going along the x-axis of the block, thereby causing nuclei in block C to exhibit Larmor frequencies outside the $f_{min}$ to $f_{max}$ frequency range.

It is desirable during imaging to receive NMR signals only from the region of interest, with the passband of the receiver rejecting unwanted signals and noise from other frequency ranges. In the case of block B, this can be accomplished by a symmetrical passband centered about the null point frequency and extending to $f_{min}$ and $f_{max}$. But to receive signals from nuclei in block C, either the passband must be widened, thereby passing unwanted signals and noise, or the passband circuitry must be retuned to pass only the frequency range of block C.

In accordance with the principles of the present invention, signals from only block C may be acquired by offsetting the $G_x$ gradient field from its nominal position so that the null point of the offset field is located at point $X_n$, $Y_o$, $Z_o$. This effect is shown in FIG. 3b, with the offset $G_x$ gradient vector arrows bounded by driving currents $I_+ + I_{B+}$ and $I_- + I_{B-}$. The offset $G_x$ gradient field results in the $f_{min}$ to $f_{max}$ frequency range being symmetrically distributed on either side of the new gradient field null point, $X_n$, $Y_o$, $Z_o$ NMR signals may now be received from block C with the same passband circuitry used to receive signals from the $f_{min}$ to $f_{max}$ frequency range of FIG. 3a. In FIG. 3b, signals from block B now exhibit frequencies above the $f_{min}$ to $f_{max}$ frequency range.

Figure 4A:
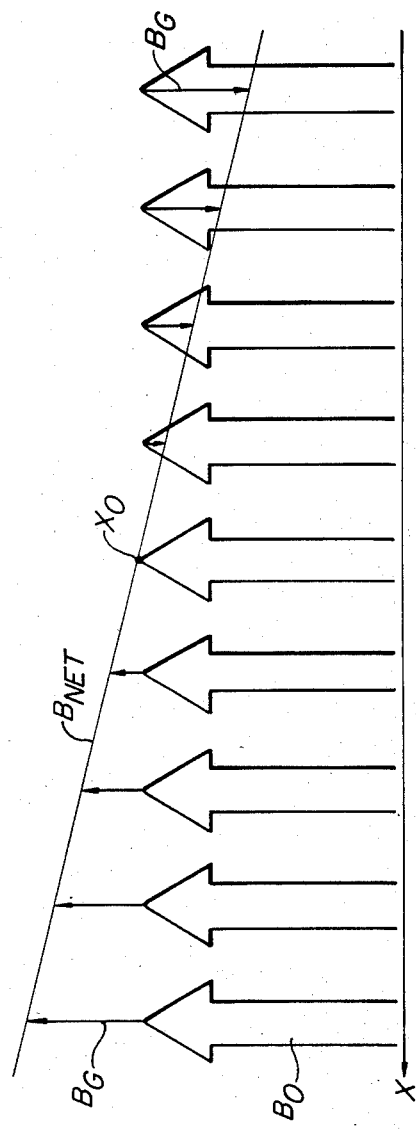
FIGS. 4a and 4b illustrate the net effect of gradient and bias fields in accordance with the principles of the present invention.
Figure 4B:
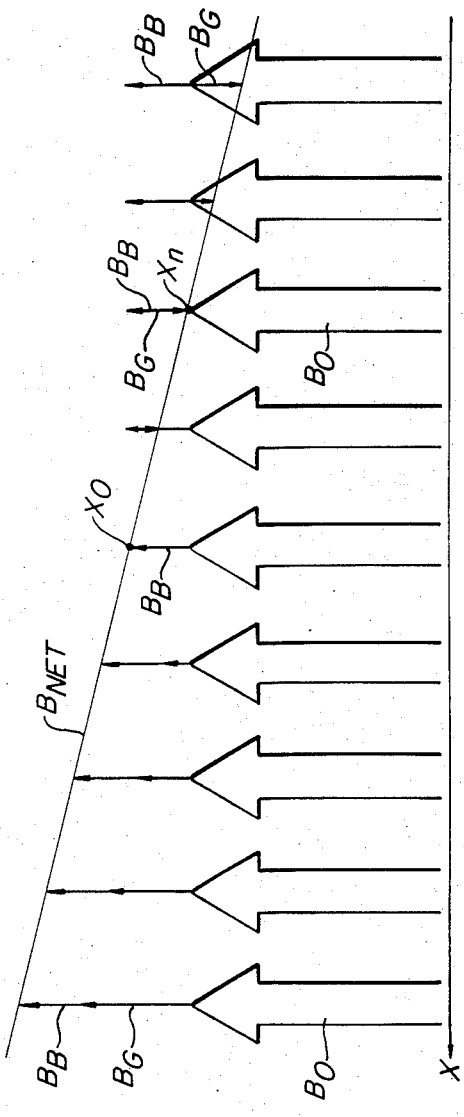

This offset effect is illustrated in a different manner in FIGS. 4a and 4b, which show the importance of the net magnetic field at any imaging point. In FIG. 4a, the large arrows represent the static magnetic field component $B_o$ existing at every point along the X axis. But at every point, the net field is the combination of the static $B_o$ field and a smaller gradient field component, $B_G$. The net field in the X direction is the linearly varying combination of the $B_o$ and $B_G$ field components, as shown by line $B_{NET}$, which connects the arrowheads of the $B_G$ components. In the middle of the drawing is the null point $X_o$, where the gradient field makes no contribution to the static $B_o$ field component. To the left of point $X_o$, the $B_G$ components add to the $B_o$ field, and to the right of point $X_o$ the $B_G$ components reduce the net field to levels less than the $B_o$ component.

In FIG. 4b, a bias field component $B_B$ is added to the other two field component shown in FIG. 4a. At each point along the X axis, the bias field component $B_B$ uniformly offsets the previous net field $B_{NET}$. The net field is thus determined by vectorially adding $B_o$, $B_G$ and $B_B$ at each point. The result of this vectorial combination is that the $B_B$ and $B_G$ components cancel each other at point $X_n$, which is now the null point of the bias and gradient fields together. Only the static field component $B_o$ remains at point $X_n$. At point $X_o$, where the gradient field $B_G$ makes no contribution to the net field, the net field is now the sum of the $B_o$ and $B_B$ components. It is therefore seen that the net field $B_{NET}$ of FIG. 4b is offset to the right as compared to the $B_{NET}$ field of FIG. 4a.

In a preferred embodiment of the present invention, the bias field is developed by a separate bias coil. The gradient coil arrangement of the system thus comprises four coils: a $G_x$ gradient coil, a $G_y$ gradient coil, a $G_z$ gradient coil, and the bias coil. The bias coil may take any shape, so long as the field produced results in an essentially uniform offset in the main field. It is also desirable that there be some sort of linear relationship between the field modulation produced by the bias coil and the field effect of the gradient coils, thereby permitting simultaneous operation of the bias and gradient coils with predictable results. Unlike the gradient coils of the preferred embodiment, the bias coil produces an effective magnetic field component at the geometric null point of the gradient fields.

The bias and gradient coils of the preferred embodiment are shown schematically in FIG. 5. The coils there shown are formed around a cylindrical coil form 20. The X, Y and Z coordinate axes are shown at one end of the coil form 20. On the visible side of the coil form cylinder 20 are a pair of $G_x$ gradient coils 22. The arrows on the coils indicate current direction. These two coils comprise half of a Golay coil configuration. A complementary pair of $G_x$ gradient coils are located on the back of the cylinder, and are not visible in FIG. 5. On the top of the coil form 20 is a pair of $G_y$ gradient coils 24, also wound in a Golay coil configuration. A complementary pair of $G_y$ gradient coils 24' is partially visible at the bottom of the coil form.

At the ends of the coil form cylinder are two loops 26 and 26' of a $G_z$ gradient coil. The current direction in loop 26 is clockwise, as indicated by arrow 27, and the current direction in loop 26' is counterclockwise, as indicated by arrow 27'. The coils 26 and 26' thus form a reverse Helmholz configuration.

These gradient coils are shown in more complete detail in U.S. Pat. No. 4,456,881, entitled "GRADIENT COIL APPARATUS FOR A MAGNETIC RESONANCE SYSTEM".

Also located at the ends of the coil form 20 are loops 30 and 30' of a bias coil arrangement. Unlike the current in the $G_z$ gradient coil 26, 26', the current in loops 30 and 30' flows in the same direction about the coil form, as indicated by arrows 31 and 31'. Loops 30 and 30' thus form a Helmholz coil configuration.

The actual winding forms of the $G_z$ coil 26, 26' and the bias coil 30, 30' are comparatively shown in FIGS. 6 and 7. The $G_z$ gradient coil is shown as a continuous winding along the coil form, with coil turns more closely spaced at the ends than in the middle of the cylinder. At the mid-point of the cylinder the winding direction reverses as shown at 28, which provides the reversal in current direction with respect to the cylinder indicated by arrows 27 and 27'.

The bias coil winding 30, 30' is shown in FIG. 7, also in the form of a spiral, with windings more closely spaced at the ends of the cylindrical coil form. The bias coil, unlike the $G_x$ gradient coil, does not reverse direction in the middle so that current flows in one direction as indicated by arrows 31, 31'. As mentioned above the bias coil may take any form so long as a uniform field offset is produced. The spiral winding pattern of FIG. 7 has been found to be advantageous because it produces a more uniform field than the standard Helmholz configuration.

In operation, the bias coil is energized or pulsed in synchronization with the gradient coils. If no field offset is desired, as in the case of imaging block B in the above example, the bias coil is not energized. The bias coil may also be used to correct undesired offsets of the usual gradient fields. For instance, if the null point of the $G_y$ gradient field is not precisely aligned with the null points of the $G_x$ and $G_y$ gradient fields during imaging of block B, the bias coil may be energized to move the effective null point of the $G_y$ gradient field back into alignment with the null points of the other two gradient fields. If the NMR uses a relatively low level static field, as in the case of a low power resistive magnet, for instance, the bias coil may even be used to compensate for small main field drifts.

Since the bias coil may be used to effect an offset in any direction, its drive current must be computed vectorially to control the magnitude and direction of the bias field. For example, assume that the three gradient coils produce a variation of the Z component of the static magnetic field in the Z direction as per the following relationships:

$$B_{xz} = k_x \, x \, i_x$$

$$B_{yz} = k_y \, y \, i_y$$

$$B_{zz} = k_z \, z \, i_z$$

where $B_{nz}$ is the Z field component due to a field gradient in the n direction, $k_n$ is the sensitivity factor of coil n to current, x, y and z are displacements from the center of the coil system in the x, y and z directions respectively, and $i_n$ is the current in the gradient coil for the n direction. From these relationships, the z component of the gradient field may be described by:

$$B_{lz}(X, Y, Z, i_x, i_y, i_z) = k_x i_x (X - X_0) + k_y i_y (Y - Y_0) + k_z i_z (Z - Z_0) \quad [1]$$

where $X_0$, $Y_0$, and $Z_0$ are the coordinates of the null point of the coil configuration. Thus, at the null point, $$B_{lz} = (X_0, Y_0, i_x, i_y, i_z) = 0 \text{ for any gradient coil currents } i_x, i_y, i_z.$$

The bias coil produces a uniform field component in the z direction, and its field may be expressed in the same manner as:

$$B_{Bl_z}(X,Y,Z,i_B) = K_B i_B \quad [2]$$

The displacement of the null point $X_o$, $Y_o$, $Z_o$ to a new null point $X_n$, $Y_n$, $Z_n$ is accomplished by making the current $i_B$ in the bias coil a linear combination of the currents in the three gradient coils according to the following relationship $$i_B = -(X_n - X_o)\frac{k_x i_x}{k_B} - (Y_n - Y_o)\frac{k_y i_y}{k_B} - (Z_n - Z_o)\frac{k_z i_z}{k_B} \quad [3]$$

By substituting equations [2] and [3] into the gradient field expression of equation [1], the net field with the bias field component is:

$$B_{lz}(X,Y,Z) = K_x i_x [(X - X_o) - (X_n - X_o)]$$
$$+ K_y i_y [(Y - Y_o) - (Y_n - Y_o)]$$
$$+ K_z i_z [(Z - Z_o) - (Z_n - Z_o)]$$

which simplifies to $$B_{lz}(X,Y,Z) = K_x i_x (X - X_n) + K_y i_y (Y - Y_n) + K_z i_z (Z - Z_n)$$

which is seen to be the desired offset gradient field with its null point at $(X_n, Y_n, Z_n)$ A further embodiment of the present invention, which makes use of double gradient coils to produce a gradient null point offset, is shown in FIGS. 8 and 9. The technique of this embodiment involves the controlled superimposition of two gradient fields of separately located null points. FIG. 8 schematically illustrates a pair of reverse Helmholz gradient coils for the z direction, wound around a coil form 20. The first pair of coils 41 and 42 are energized with oppositely flowing currents as indicated by arrows $I_{41}$ and $I_{42}$. This pair of coils, when energized by currents of equal magnitude, exhibits a field null point $n_{12}$ located midway between the two loops. Similarly, coils 43 and 44 are energized with currents flowing as indicated by arrows $I_{43}$ and $I_{44}$. Coils 43 and 44, when equally energized, exhibit a field null point $n_{34}$ located midway between those two loops. In a preferred embodiment, coil 41 is connected to coil 42, and coil 43 is connected to coil 44, so that $I_{41}$ equals $I_{42}$ and $I_{43}$ equals $I_{44}$, with current directions as indicated in FIG. 8.

When one coil pair 41, 42 or 43, 44 is energized and the other coil pair not energized, the null point will be at either $n_{12}$ or $n_{34}$. When the coil pairs are energized simultaneously and equally, the null point will be halfway between $n_{12}$ and $n_{34}$, at approximately the midpoint of the coil form. In general, if the coils exhibit equal sensitivity, the null point n can be calculated as:

$$n = \frac{n_{12} I_{41} + n_{34} I_{43}}{I_{41} + I_{43}}$$

where $I_{41} = I_{42}$ and $I_{43} = I_{44}$ in magnitude. Thus, the currents of the coil pairs can be modulated in complementary fashion to achieve the desired z gradient null point within the range of $n_{12}$ to $n_{34}$. It is to be noted that this coil arrangement obviates the need for any further z gradient coils for the range of $n_{12}$ to $n_{34}$.

In a similar manner, asymmetric coil pairs can offset the null points for x and y gradients. One embodiment for the x direction is shown in FIGS. 9a and 9b. These FIGURES illustrate Golay coil configurations, in which the current directions are indicated by arrows on the loops nearest the viewer. For ease of illustration, the coil form is removed. In FIG. 9a, loops 51 are nearest the viewer, and oppose smaller loops 51', which are in back. Since the opposing loops are asymmetric, the field null point will not be at the center C, but to the left of center as indicated at n. In FIG. 9b, the smaller loops 53 are in front, and larger loops 53' are in back. The loops 53, 53' will exhibit a field null point n to the right of center C.

In a preferred embodiment, the coils of FIGS. 9a and 9b would overlay each other on the same coil form. When only coils 51, 51' are energized, the null point n is located as indicated in FIG. 9a. Similarly, when only coils 53, 53' are energized, the null point n is located as shown in FIG. 9b. Complementary control of currents in the loops can move the null to any point between the indicated n points. Equal magnitude energization, assuming equal coil sensitivity, will locate the null point at the center C. For maximum freedom, four coil amplifiers are necessary: one for coils 51, one for coils 51', one for coils 53, and one for coils 53'. In general, the current in opposing coils 51−51' and 53−53' in the two FIGURES will not be the same. Hence, care is required in the exact proportioning of the relative coil currents.

Similar asymmetric coil pairs for the y direction would be oriented 90° with respect to the coils of FIGS. 9a and 9b.

A further technique for developing the gradient null point offset is to form a bias coil from two $G_z$ coils, such as those shown in FIG. 6, with their respective null points offset from each other, as in FIG. 8. Such an embodiment takes advantage of the field uniformity of spirally wound coils. Two offset $G_z$ coils could be described by their fields, $B_{z1}$ and $B_{z2}$ as:

$$B_{z1} = I_1 a_1 * (Z - Z_1), \text{ and}$$

$$B_{z2} = I_2 a_2 * (Z - Z_2)$$

where $I_1$ and $I_2$ are the coil currents, $a_1$ and $a_2$ the coil sensitivity factors, $Z_1$ and $Z_2$ the z null points, and Z the displacement from the center of the coil system. If the coils exhibit substantially identical sensitivity factors, $a_1 = a_2$. When the coils are energized by equal and opposite currents, $I_2 = -I_1$ and the net field is:

$$B_{z1} + B_{z2} = a[I_1(Z - Z_1) - I_1(Z - Z_1)]$$

Cancelling terms yields $$B_{z1} + B_{z2} = a I_1 (Z_2 - Z_1)$$

an expression independent of Z displacement. The field, and hence the null point may thus be varied by varying the current applied to the coils.

What is claimed is:

1. In a nuclear magnetic resonance imaging system, including a magnet for developing a main magnetic field, apparatus for producing a magnetic field gradient comprising:

first coil means for producing, when energized by a first current, a first gradient magnetic field which varies in a first direction within a region of said main magnetic field;

second coil means for producing, when energized by a second current, a second gradient magnetic field which varies in a second direction orthogonal to said first direction within a region of said main magnetic field;

third coil means for producing, when energized by a third current, a third gradient magnetic field which varies in a third direction orthogonal to said first and second directions within a region of said main magnetic field;

said gradient magnetic fields defining a reference point of gradient field intensity within said region; and bias coil means for producing a substantially uniform offset in the magnetic field intensity within said region, said bias coil means being energized by a bias current which is a combination of said first, second and third energizing currents.

2. The nuclear magnetic resonance imaging system of claim 1, wherein the magnetic field intensity at points within said region is the sum of components of said main magnetic field, energized ones of said gradient magnetic fields, and a bias field produced by said bias coil means, said bias coil means being selectively energized in synchronization with ones of said first, second, and third coil means for selectively redefining the location of said reference point in any direction within said region.

3. The nuclear magnetic resonance imaging system of claim 1, wherein said main magnetic field is oriented in a given direction; wherein said gradient magnetic fields contribute to said main magnetic field in differing amounts of intensity at points along respective axes within said region; and wherein said bias coil means contributes to said main magnetic field in substantially uniform amounts of intensity at said points along said axes.

4. The nuclear magnetic resonance imaging system of claim 3, wherein said reference point of gradient field intensity is a null point od said axes at which said gradient magnetic fields make substantially no contribution to said main magnetic field, said contributions at points on respective sides of said null point being of respective opposite senses.

5. The nuclear magnetic resonance imaging system of claim 4, wherein said bias coil means is capable of producing a non-zero contribution to the field intensity at said null point.

6. The nuclear magnetic resonance imaging system of claim 1, wherein said gradient magnetic field producing means includes a gradient field coil; and wherein said bias field means includes a bias field coil. cylindrical volume within said bias field coil.

7. The nuclear magnetic resonance imaging system of claim 6, wherein said bias field coil is wound in a Helmholz coil configuration.

8. In a nuclear magnetic resonance imaging sytem, including a magnet for developing a main magnetic field, apparatus for producing a magnetic field gradient comprising:

means for producing a gradient magnetic field within a region of said main magnetic field, said gradient magnetic field being distributed about a reference point of gradient field intensity within said region; and bias field means for producing a substantially uniform offset in the magnetic field intensity within said region;

wherein said gradient magnetic field producing means includes a gradient field coil; and wherein said bias field means includes a bias field coil; and wherein said main magnetic field is oriented in the direction of a given axis, and wherein said bias field coil is wound in a generally spiral form about said given axis, said region being located within the generally cylindrical volume within said bias field coil.

9. In a nuclear magnetic resonance imaging system, including a magnet for developing a main magnetic field, magnetic field gradient apparatus comprising:

means for producing a first gradient magnetic field within a region of said main magnetic field, said first gradient magnetic field being distributed about a first reference point of gradient field intensity, which first reference point is located at a first point on an axis within said region; and means for producing a second gradient magnetic field within said region of said main magnetic field, said second gradient magnetic field being distributed about a second reference point of gradient field intensity, which second reference point is located at a second point different than said first point on said axis.

10. The nuclear magnetic resonance imaging system of claim 9, wherein said first and second gradient magnetic fields both exhibit field gradients varying in substantially the same direction, and wherein said first and second gradient magnetic field are superimposed within said region.

11. In a nuclear magnetic resonance imaging system, including a magnet for developing a main magnetic field, magnetic field gradient apparatus comprising:

means for producing a first gradient magnetic field within a region of said main magnetic field, said first gradient magnetic field being distributed about a first reference point of gradient field intensity, which first reference point is located on an axis within said region; and means for producing a second gradient magnetic field within said region of said main magnetic field, said second gradient magnetic field being distributed about a second reference point of gradient field intensity, which second reference point is located on said axis, wherein said first and second gradient magnetic fields form a composite gradient magnetic field exhibiting a reference point of composite gradient field intensity located on said axis; and wherein said first gradient magnetic field producing means includes a first reverse Helmholz coil configuration, and wherein said second gradient magnetic field producing means includes a second reverse Helmholz coil configuration.

12. In a nuclear magnetic resonance imaging system, including a magnet for developing a main magnetic field, magnetic field gradient apparatus comprising:

means for producing gradient magnetic field within a region of said main magnetic field, said first gradient magnetic field being distributed about a first reference point of gradient field intensity, which first reference point is located on an axis within said region; and means for producing a second gradient magnetic field within said region of said main magnetic field, said second gradient magnetic field being distributed about a second reference point of gradient field intensity, which second reference point is located on said axis, wherein said first and second gradient magnetic fields form a composite gradient magnetic field exhibiting a reference point of composite gradient field intensity located on said axis;

wherein said first gradient magnetic field producing means includes a first Golay coil configuration, and wherein said second gradient magnetic field producing means includes a second Golay coil configuration; and wherein each Golay coil configuration includes a pair of coils which are asymmetric with respect to each other and are positioned around a central axis.

13. In a nuclear magnetic resonance imaging system, including a magnet for developing a main magnetic field, magnetic field gradient apparatus comprising:

means for producing a first gradient magnetic field within a region of said main magnetic field, said first gradient magnetic field being distributed about a first reference point of gradient field intensity, which first reference point is located on an axis within said region; and means for producing a second gradient magnetic field within said region of said main magnetic field, said second gradient magnetic field being distributed about a second reference point of gradient field intensity, which second reference point is located on said axis, wherein said first and second gradient magnetic fields form a composite gradient magnetic field exhibiting a reference point of composite gradient field intensity located on said axis; and wherein said gradient magnetic field producing means comprise spirally wound coils surrounding a cylindrical volume, said axis being the longitudinal axis of said cylindrical volume.

* * * * *